(12) United States Patent
Tanielian et al.

(10) Patent No.: US 11,415,646 B2
(45) Date of Patent: Aug. 16, 2022

(54) MAGNETIC FIELD VISUALIZATION USING MODULATION SCREEN AND COMPRESSIVE SENSING

(71) Applicant: The Boeing Company, Chicago, IL (US)

(72) Inventors: Minas H. Tanielian, Bellevue, WA (US); Mateus S. Daczko, Olympia, WA (US); Lindsay Martin, Seattle, WA (US); Alec Adams, Seattle, WA (US); Carlene Goodbody, Seattle, WA (US)

(73) Assignee: The Boeing Company, Chicago, IL (US)

( * ) Notice: Subject to any disclaimer, the term of this patent is extended or adjusted under 35 U.S.C. 154(b) by 312 days.

(21) Appl. No.: 16/853,495

(22) Filed: Apr. 20, 2020

(65) Prior Publication Data
US 2021/0325487 A1    Oct. 21, 2021

(51) Int. Cl.
*G01R 33/10* (2006.01)
*G01R 33/00* (2006.01)
*G01R 33/26* (2006.01)

(52) U.S. Cl.
CPC ......... *G01R 33/10* (2013.01); *G01R 33/0017* (2013.01); *G01R 33/0088* (2013.01); *G01R 33/26* (2013.01)

(58) Field of Classification Search
CPC ............... G01R 33/00; G01R 33/0035; G01R 33/0023; G01R 33/0017; G01R 31/3191;
(Continued)

(56) References Cited

U.S. PATENT DOCUMENTS

| 4,951,674 A | * | 8/1990 | Zanakis | A61B 5/242 600/409 |
| 5,661,401 A | * | 8/1997 | Ishikawa | G01R 33/3875 324/319 |

(Continued)

FOREIGN PATENT DOCUMENTS

JP    2000037362 A    2/2000

OTHER PUBLICATIONS

Extended European Search Report (EESR) dated Sep. 20, 2021, in European Patent Application No. 20166659.9 (European counterpart of the instant U.S. patent application).
(Continued)

*Primary Examiner* — Jermele M Hollington
*Assistant Examiner* — Taqi R Nasir
(74) *Attorney, Agent, or Firm* — Ostrager Chong Flaherty & Broitman P.C.

(57) ABSTRACT

Systems and methods for providing a visualization capability to map magnetic fields. The system utilizes a high-sensitivity magnetic field sensor (e.g., a magnetometer inside a tube made of magnetic shielding material) disposed on one side of a magnetic field modulation screen to acquire measurement data representing an image of a magnetic field. The magnetic field modulation screen includes a multiplicity of magnetic field-generating pixel elements (e.g., current-carrying loops made of electrically conductive material). Optionally, the system also uses compressive sensing techniques to reduce the amount of measurement data required to reconstruct an image of the original magnetic field. Compressive sensing is enabled by not supplying current to a different selected individual magnetic field-generating pixel element of the magnetic field modulation screen at successive sampling times.

20 Claims, 9 Drawing Sheets

(58) Field of Classification Search
CPC .... G01R 33/10; G01R 33/0088; G01R 33/26; G01B 7/004; G01C 17/38; G06F 3/017; G06F 3/0346; G06F 3/012
See application file for complete search history.

(56) References Cited

U.S. PATENT DOCUMENTS

| | | |
|---|---|---|
| 9,116,201 B2 | 8/2015 | Shah et al. |
| 9,797,964 B2 | 10/2017 | Vervaeke |
| 2016/0014310 A1 | 1/2016 | Kelly et al. |
| 2016/0109535 A1 | 4/2016 | Deak |
| 2016/0223627 A1 | 8/2016 | Shah et al. |
| 2016/0370441 A1* | 12/2016 | Goodson ............ G01R 33/0023 |
| 2018/0238974 A1 | 8/2018 | Shah et al. |

OTHER PUBLICATIONS

Baraniuk, "Compressive Sensing", IEEE Signal Processing Magazine, Jul. 2007, pp. 118-120 and 124.

\* cited by examiner

MAGNETIC FIELD VISUALIZATION USING MODULATION SCREEN AND COMPRESSIVE SENSING

BACKGROUND

The technology disclosed herein generally relates to the visualization of magnetic fields.

Magnetic fields are ubiquitous in human environments and they span a huge frequency range anywhere from static fields associated with magnetic materials and the Earth's magnetic field at a given location to variable fields associated with electromagnetic waves originating from a variety of man-made or natural sources, including induced fields due to the motion of conductive surfaces in the Earth's magnetic field.

The lowest band of electromagnetic waves commonly utilized in applications is referred to as Extremely Low Frequencies (ELF), which category includes frequencies as low as a few Hertz and is typically used in submarine communications. There are currently a number of technologies that are utilized to visualize electromagnetic fields in the radio frequency or microwave range (e.g., magnetic resonance imaging and radar), but these are active imaging sources requiring some sort of prior stimulation and are unsuitable for visualizing magnetic fields at very low frequencies. One exception is the use of iron filings to map static fields (e.g. fields generated from a permanent magnet), mainly used for instructional purposes. Another exception is the use of arrays of less sensitive Hall effect sensors to do static imaging of magnetic field arrangements. There is a need, however, to visualize magnetic fields at very low frequencies generated by people or equipment (that are nearly static) which can be rendered into an electronic format. One method that has been used in this regime, for visualization of magnetic fields in the brain, is magnetoencephalography, which relies on the use of multiple electrodes whose outputs are then computationally synthesized to create a three-dimensional image. This technique is not, however, suitable to create images of moving objects and requires an array of sensors, as opposed to a single sensor.

The foregoing shortcoming in magnetic field mapping is not due to the fact that there are no sensitive magnetic field sensors (magnetometers) capable of detecting the tiny magnetic fields generated by a variety of sources, but rather due to the lack of low-cost, compact, extremely sensitive magnetic detector arrays. For instance, a large array of coil-based magnetometers is utilized to create an image in magnetic resonance imaging. These arrays are expensive, bulky, and only work at much higher (radio) frequencies (RF). Furthermore, such systems typically detect large-amplitude fields that have been generated using an RF magnetic "illumination" source (similar to the way radar operates) to form an image.

The state of the art may be advanced by providing a compact system that utilizes a high-sensitivity magnetometer which can form an image using a single detector without the need of an illumination source.

SUMMARY

The subject matter disclosed in detail below is directed to systems and methods for providing a visualization capability to map low-level or static magnetic fields, such as those generated by a human in a building or a submarine or other sources. In accordance with some embodiments, the system utilizes a high-sensitivity magnetic field sensor (e.g., a magnetometer) disposed on one side of a magnetic field modulation screen to acquire measurement data representing an image of a magnetic field. The magnetic field sensor may be a shielded total-field sensor or a directional/vector sensor. The magnetic field modulation screen includes a multiplicity of magnetic field-generating pixel elements (e.g., current-carrying loops made of magnetic field-generating material).

In accordance with one proposed implementation, the system utilizes a magnetometer with sensitivity greater than 1 $pT/Hz^{1/2}$, such as an atomic magnetometer. An atomic magnetometer can detect fields anywhere from constant (direct current) up to several hundred hertz (alternating magnetic amplitude). A typical atomic magnetometer is categorized as a total-field or scalar magnetometer because it only measures the total field at a point in space and time with no directionality (scalar measurement). However, the technique proposed herein is not limited to scalar magnetometers and is readily adaptable to directional/vector magnetometers as well. The systems and methods proposed herein provide a combination of spatial- and time-resolved signals. In some cases, a total-field magnetometer is converted through shielding techniques and proximity of the pixel array to recreate pseudo vector information. A vector-based magnetometer may be an alternative to a total-field magnetometer and may even require less shielding, The technology disclosed in some detail below allows for visualizing low-level magnetic fields (e.g., smaller than the Earth's magnetic field by a factor of 1,000 to 10,000) in order to visualize and identify a moving object. This is complicated by a variety of fields generated by spurious sources, including living objects. Being able to discern the signature of a particular source apart from the large background is a challenge, especially in a single sensor with a reasonable form factor, resolution, and cost.

Optionally, the system also uses compressive sensing techniques to capture and represent compressible signals at a rate significantly below the Nyquist rate, thereby reducing the amount of measurement data which needs to be transmitted and stored. Compressive sensing is enabled by not supplying current to a different selected individual magnetic field-generating pixel element of the magnetic field modulation screen at successive sampling times.

Although various embodiments of systems and methods for visualizing low-level magnetic fields are described in some detail later herein, one or more of those embodiments may be characterized by one or more of the following aspects.

One aspect of the subject matter disclosed in detail below is a magnetic field sensing system comprising a magnetometer, a magnetic field modulation screen, and a support frame that supports the magnetometer and magnetic field modulation screen in a positional relationship. In accordance with one embodiment, the magnetic field modulation screen comprises an array of individually addressable and controllable magnetic field-generating elements and an array of switches arranged to switchably connect a current source to respective magnetic field-generating elements. In accordance with one proposed implementation, the magnetic field modulation screen comprises a plurality of printed circuit boards having respective sets of magnetic field-generating elements printed thereon. the printed circuit boards being positioned in overlapping relationship such that the sets of magnetic field-generating elements are offset from each other.

In accordance with some embodiments of the magnetic field sensing system described in the immediately preceding paragraph, the system further comprises: a controller connected to the array of switches and configured to control the switches to provide current from the current source to all but one of the magnetic field-generating elements; and a processing node connected to the controller and configured to send control signals to the controller which cause the magnetic field modulation screen to adopt successive states in which a different one of the magnetic field-generating elements does not receive current from the current source at successive instants in time.

In accordance with other embodiments, the system further comprises a processing node connected to the array of switches and configured to control the switches to adopt successive states in which a different one of the magnetic field-generating elements does not receive current from the current source at successive instants in time.

Another aspect of the subject matter disclosed in detail below is a magnetic field visualization system comprising: a current source; a display device configured to display an image representing a magnetic field distribution; a magnetometer configured to detect a magnetic field during a time interval and output electrical signals containing magnetic field measurement data; a magnetic field modulation screen disposed with a fixed positional relationship to the magnetometer, wherein the magnetic field modulation screen comprises an array of magnetic field-generating elements and an array of switches respectively connected to the magnetic field-generating elements and to the current source; and a processing node connected to the array of switches and configured to control the switches to adopt successive states in which a different one of the magnetic field-generating elements does not receive current from the current source at successive instants during the time interval. The processing node is further configured to process the magnetic field measurement data using an image reconstruction algorithm to reconstruct an image representing a distribution of the magnetic field using compressive sensing techniques and then send the processed data to the display device for display of the image representing the distribution of the detected magnetic field.

A further aspect of the subject matter disclosed in detail below is a magnetic field modulation screen comprising: a first printed circuit board having a first spaced set of the magnetic field-generating elements printed thereon; a second printed circuit board having a second spaced set of the magnetic field-generating elements printed thereon, a third printed circuit board having a third spaced set of the magnetic field-generating elements printed thereon; and a fourth printed circuit board having a fourth spaced set of the magnetic field-generating elements printed thereon, wherein the first through fourth printed circuit boards are positioned in overlapping relationship with each of the first through fourth spaced sets being offset from the others. In accordance with one embodiment, each magnetic field-generating element comprises a loop.

Yet another aspect of the subject matter disclosed in detail below is a method for visualizing a magnetic field comprising: placing a magnetic field modulation screen comprising an array of individually addressable and controllable magnetic field-generating elements in a fixed position relative to a magnetometer; placing the magnetometer and the magnetic field modulation screen in a magnetic field; operating the magnetometer to continuously detect the magnetic field during a time interval and output electrical signals containing magnetic field measurement data; operating the magnetic field modulation screen such that a different one of the magnetic field-generating elements does not receive current from the current source at successive instants during the time interval; processing the magnetic field measurement data using an image reconstruction algorithm that incorporates compressive sensing techniques to reconstruct an image representing a distribution of the magnetic field; and displaying the image representing the distribution of the detected magnetic field.

Other aspects of systems and methods for visualizing low-level magnetic fields are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

Reference will hereinafter be made to the drawings in which similar elements in different drawings bear the same reference numerals.

DETAILED DESCRIPTION

Illustrative embodiments of systems and methods for visualizing magnetic fields are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

In accordance with the embodiments described in some detail below, the magnetic field visualization system utilizes a high-sensitivity magnetic field sensor (e.g., an atomic magnetometer) disposed on one side of a magnetic field modulation screen to acquire measurement data representing an image of a magnetic field emanating from a source on the other side of the magnetic field modulation screen. The magnetic field modulation screen includes a multiplicity of magnetic field-generating pixel elements (e.g., current-carrying loops made of electrically conductive material).

Optionally, the system also uses compressive sensing techniques to capture and represent compressible signals at a rate significantly below the Nyquist rate, thereby reducing the amount of measurement data which needs to be transmitted and stored. Compressive sensing is enabled by selectively not supplying current to individual magnetic field-generating pixel elements of the magnetic field modulation screen.

Compressive sensing (a.k.a. "compressive sampling") has been employed in the past to create images utilizing only a single pixel detector in the frequency range between terahertz wave and visible range. Compressive sensing leverages a mathematical property that is true of most images: an image may be considered to be "sparse" in some particular basis set function in N-dimensional space. This means that the image can be represented by using a small set of basis vectors (most of the rest being either very small or zero) and can thus be generated using a small set of measurements, much smaller than the number of pixels the image is made of. Compressive sensing converts an analog image to an N-dimensional vector by having the single pixel sensor record a number of images of a scene by viewing the images through a magnetic field modulation screen which functions as a pseudo-random filter of 0 s and 1 s. Once those signals are recorded by the single pixel detector, one can decode (decompress) the signal by knowing the algorithm that created the filter of 0 s and 1 s to recover the original image.

The system proposed herein combines the principles of compressive sensing with the extreme sensitivity of an atomic magnetometer to create an image of a magnetic field, including changes in the field within the field of view of the magnetic field sensor. In the following paragraphs, an example system is described. The system comprises a magnetic field sensor, a pseudo-random image creation (pixel generation) algorithm, a magnetic field modulation screen that operates as a physical imaging filter; and an image reconstruction algorithm. The pseudo-random image creation algorithm and image reconstruction algorithm are configured to apply a compressive sensing technique that reduces the number of measurements needed in order to visualize a magnetic field.

One sufficiently sensitive magnetic field sensor is an atomic magnetometer that utilizes optical transitions between energy levels of the $^{85}$Rb isotope to measure the total magnetic field (scalar) at a given location. Practical implementations of such a magnetometer can have a variety of configurations and alkali vapor elements. Furthermore, the system and concept described herein do not require the use of a $^{85}$Rb magnetometer but rather any magnetometer that can measure magnetic fields with very high sensitivity and accuracy may be employed. The use of a $^{85}$Rb magnetometer is one example case to illustrate concepts on which the technology proposed herein is based.

In the $^{85}$Rb magnetometer, circularly polarized light pumps atoms from the ground state to an excited state, which has a high Zeeman magnetic moment $m_F$. This excitation is detected optically by a sensitive light detector. When the atoms from the excited state return to the ground state with re-emission of light, $m_F$ changes according to the normal rules by ±1 or 0. If the light polarization is adjusted so as to produce $m_F$=+1 transitions, then these processes after re-emission will result in an increase in the population of the lower state with large $m_F$ values and the light intensity transmitted through the $^{85}$Rb vapor will decrease. Subsequently, if the lower-state atoms with higher $m_F$ values are depolarized using an RF field, the RF frequency $\omega_L$ (Larmor frequency) used will scale with the total strength of the ambient magnetic field. This is witnessed optically by an increase in the optical transmission through the $^{85}$Rb vapor. This simplified explanation illustrates some of the basic elements of how the sensor operates.

To implement the concept of compressive sensing, the methodology proposed herein: (a) limits the field of view of the sensor to a planar aperture; and (b) uses a sensor to view the "image" through a modulation screen that can generate 0 s and 1 s in the field of view of the sensor using a pseudo-random 0 and 1 pixel generation algorithm, which in turn divides the planar aperture into a set of pixels having respective values which are transmitted to a processor and recorded in a non-transitory tangible computer-readable storage medium. In accordance with one embodiment, each pixel is not individually sensed. The whole screen is measured as one image and, assuming the sampling is fast enough or the image is not rapidly changing, through comparing each of the samples and knowing the pattern, one can deduce the value at each pixel, thereby reconstructing the image.

In accordance with one proposed implementation, the sensor element is a small (e.g., a few millimeters in size) sealed cavity in an atomic magnetometer. The sensor element in an atomic magnetometer is typically housed in a larger part that is on the order of a few centimeters in size, which larger part typically also contains some of the electronics needed to run the sensing element. To achieve objective (a), the sensing element is placed inside a tube made of magnetic shielding material. The field of view of the magnetometer is defined by the geometry of the tube, including the size and shape of the opening at one end of the magnetic shielding tube.

Figure 1:
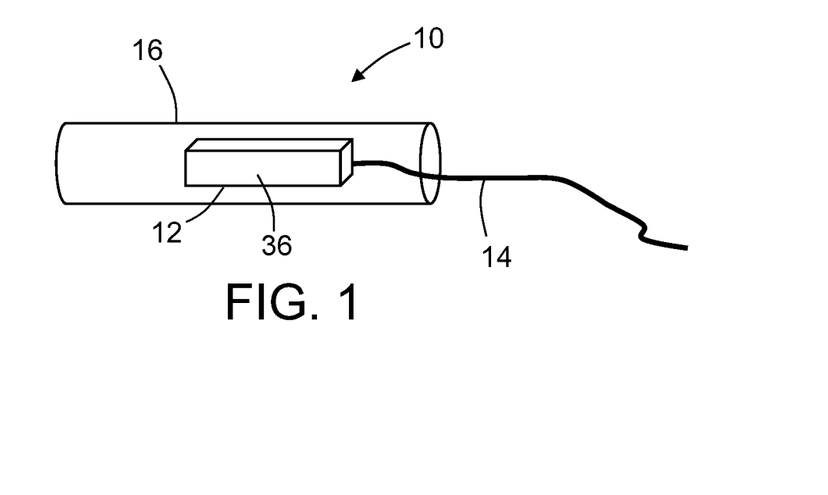
FIG. 1 is a diagram representing a three-dimensional view of a magnetic field sensor inside a tube made of magnetic shielding material in accordance with one embodiment.

FIG. 1 is a diagram representing a three-dimensional view of a magnetic field sensor 10 in accordance with one embodiment. The magnetic field sensor 10 includes a scalar magnetometer 12 (hereinafter "magnetometer 12") inside a tube 16 made of magnetic shielding material. The tube 16 has a lengthwise axis with openings at opposite ends of the tube. In accordance with one embodiment, the geometry of the tube 16 is a circular cylinder with circular openings at opposed ends thereof. When the magnetometer 12 is placed inside the tube 16, the field of view of magnetometer 12 is defined by the geometry of tube 16, including the size and shape of the opening at the end of tube 16 that is disposed between magnetometer 12 and the source of the magnetic field being imaged.

In accordance with one embodiment, the magnetometer 12 is an atomic magnetometer that includes a cell (disposed inside the external housing) containing an alkali metal vapor (e.g., $^{85}$Rb vapor). The cell is made of glass or other transparent material. The cell may be heated to provide a specified density of alkali metal atoms. A pump light beam, generated by a laser (not shown in FIG. 1), is directed through a linear polarizer to linearly polarize the pump light beam. The pump light beam is typically expanded and collimated by one or more lenses and then directed through an optical waveplate that converts the pump light beam from linearly polarized to circularly polarized. The circularly polarized light is then directed through the cell containing the alkali metal vapor. After passing through the vapor cell, the light beam impinges on a photodetector (not shown in FIG. 1), which converts the impinging photons into an electrical signal that is a measure of the amount of light transmitted through the cell. The electrical signal is output to a signal processor via an electrical cable 14. The amount of light collected by the photodetector is proportional to the degree of spin polarization of the alkali atoms in the direction parallel to the optical path of the pump light transmitted by the vapor cell. The degree of spin polarization in turn is a function of the magnetic field in the vicinity of the vapor cell.

As previously mentioned, to limit its field of view, the magnetometer 12 is placed inside a tube 16 made of magnetic shielding material. In accordance with one proposed implementation, the sensor magnetic shielding material is a high-permeability ferromagnetic metallic alloy, such as Mu-METAL®, which is commercially available from Magnetic Shield Corp., Bensenville, Ill. For example, nickel-iron soft ferromagnetic alloys experience high magnetization in the bulk due to an external field, but have very low remnant magnetization, i.e., the magnetization essentially disappears when the magnetic field is removed. Due to this property, high-permeability ferromagnetic metallic alloys are often used for magnetic shielding applications, although higher-frequency magnetic shielding can also be done using a different set of materials, such as ferrites. High-permeability ferromagnetic metallic alloys have several compositions. One such composition is approximately 77% nickel, 16% iron, 5% copper, and 2% chromium or molybdenum. Another composition is approximately 80% nickel, 5% molybdenum, small amounts of various other elements such as silicon, and the remaining 12 to 15% iron. A number of different proprietary formulations of the alloy are sold under various trade names. High-permeability ferromagnetic metallic alloys typically have relative permeability values of 80,000-100,000 compared to several thousand for ordinary steel.

In accordance with one embodiment, the sensor views the "image" (i.e., magnetic field distribution) through the screen and the sensor then transmits to the processor the data that was sampled at that instant in time. The sensor views the image through a set of pixels that can be either left transparent or rendered opaque, according to an algorithm. The difficulty arises in trying to set some of the pixels to an effective value that is much lower than the signal flowing through them, i.e., creating zero value (opaque) pixels. In optical applications of compressive sensing, this is easily achieved by projecting the image of interest onto a digital micro-mirror array prior to projecting the image onto the sensor. Digital micro-mirror chips comprise a very large number of aluminum mirrors (millions) on a silicon substrate. Each mirror (tens of micrometers in size) is individually addressable. The mirror has two states (equivalent to 0 and 1). This disclosure will refer to the state as "1" when the micro-mirror projects the light (pixel) onto the sensor, while to the state "0" when the micro-mirror diverts the light away from the sensor.

There is no such equivalent in the case of magnetic fields, especially if one is interested in lower-frequency magnetic fields where the equivalent electromagnetic wave could have a wavelength on the order of many miles. The technology disclosed herein solves this problem by creating magnetic field-generating loops representing pixels (hereinafter "pixel loops") that are millimeters in size on a circuit board. The size of the pixels may vary depending on the resolution and amplitude of the magnetic fields present in a given application as well as the image integrity. The pixels in this example consist of metal loops that can generate a magnetic field when a current flows through them.

Figure 2:
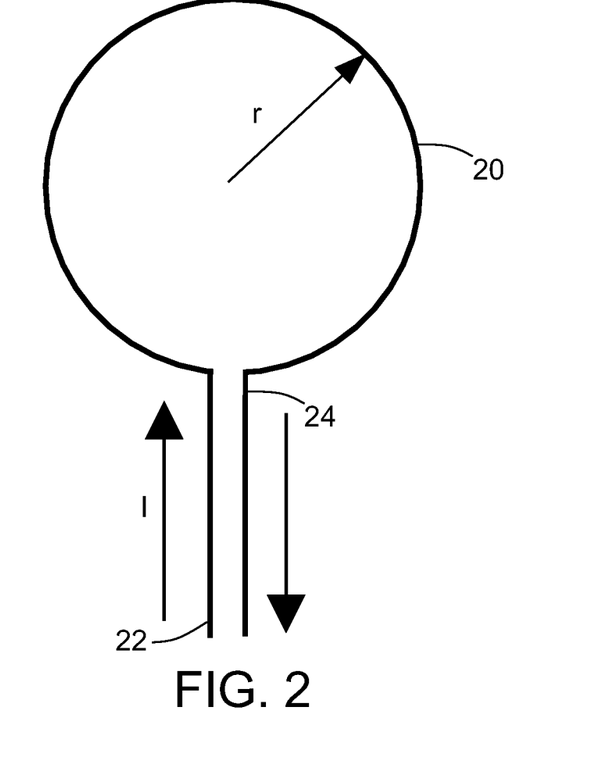
FIG. 2 is a diagram representing a pixel loop made of magnetic field-generating material, which loop may be replicated multiple times on a printed circuit board to form a magnetic field modulation screen in accordance with one embodiment.

FIG. 2 is a diagram representing one example of a pixel loop 20 made of electrically conductive material, which pixel loop 20 may be replicated multiple times on a printed circuit board to form a magnetic field modulation screen in accordance with one embodiment. In this example, the pixel loop 20 is circular and has a radius r. In other embodiments, the pixel loop may have a non-circular shape (e.g., square or elliptical). A current I flows through the pixel loop 20 via current feed lines 22 and 24. The current feed lines 22 and 24 are placed in parallel and in contact with each other so that the respective magnetic fields associated with the oppositely flowing currents in the feed lines cancel each other, due to the adjacency, similar to the way in which twisted pairs of conductors eliminate magnetic fields due to the wires. As previously mentioned, to create pixels that essentially represent the image or signal (this is equivalent to the micro-mirror projecting its pixel onto the sensor), one would refrain from passing any current through those particular loops. To create the equivalent of a 0 or a near zero value present in a pixel, a signal is fed in each individually addressable pixel loop with a current that generates a magnetic field in the pixel loop 20. The current signal is one of "white noise", i.e., a signal whose time average is essentially zero. One caveat is that the characteristic frequency of the white noise current injected into the loops should be much higher than the frequency response of the sensor, so that the sensor will only detect the time average of the white noise. The magnitude of the injected current will be adjusted to scale so that the induced magnetic field in the pixel loop 20 is comparable to the magnitude of the magnetic field which the sensor is trying to detect. The current magnitude may be set either by having a priori knowledge of the signal that needs to be detected or by measuring the total field the sensor is detecting, especially if one is interested in magnetic fields that vary with time. Furthermore, it is possible to lower the duty cycle of the white noise generated in the loops and still achieve a satisfactory result, if there is a need to minimize the heat generated in the control circuitry. On the other hand, the refresh rate (compressive sensing) should be done at a frequency that can be detected by the sensor element.

Figure 3A:
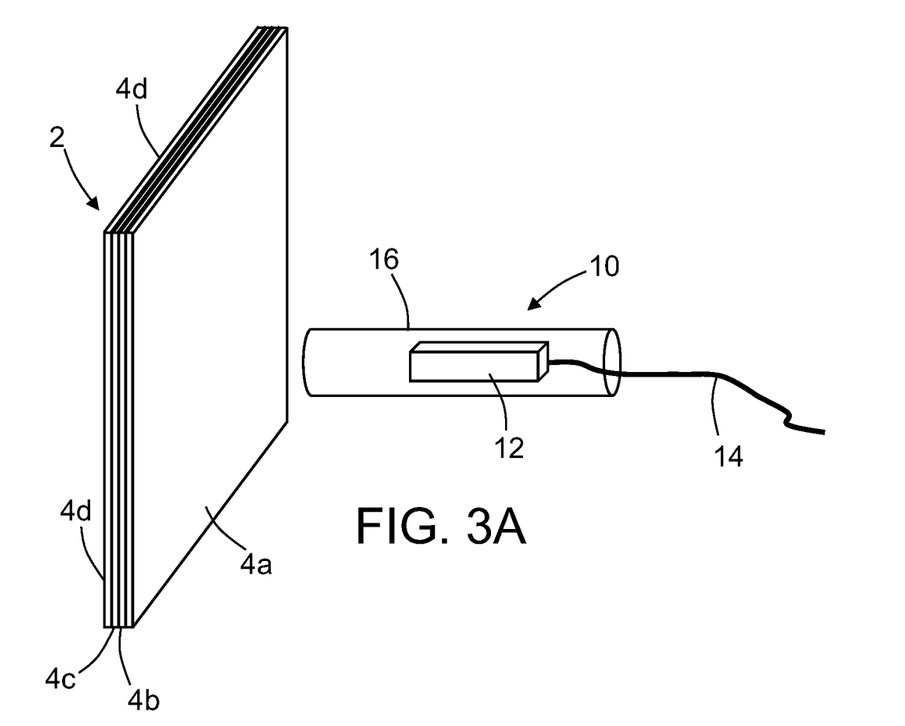
FIG. 3A is a diagram representing a three-dimensional view of a magnetic field sensor inside a tube made of magnetic shielding material in positional relationship with a magnetic field modulation screen comprising stacked printed circuit boards (PCBs) having pixel loops of the type depicted in FIG. 2.

FIG. 3A is a diagram representing a three-dimensional view of a magnetic field sensor 10 of the type depicted in FIG. 1 in positional relationship with a magnetic field modulation screen 2. The magnetic field modulation screen 2 includes a plurality of printed circuit boards (PCBs) arranged in a stack that is disposed in the field of view of the sensor 10. The example magnetic field modulation screen 2 depicted in FIG. 3A has four PCBs 4a-4d which overlap each other to form a planar aperture. Each of the PCBs 4a-4d has a respective array of pixel loops (not shown in FIG. 3A) printed on the board, which arrays are offset from each other, as will be explained in more detail below with reference to FIGS. 4A-4C. The overlapping square in the intersection of the four boards is the imaging plane (pixel array) available to the sensor.

Figure 3B:
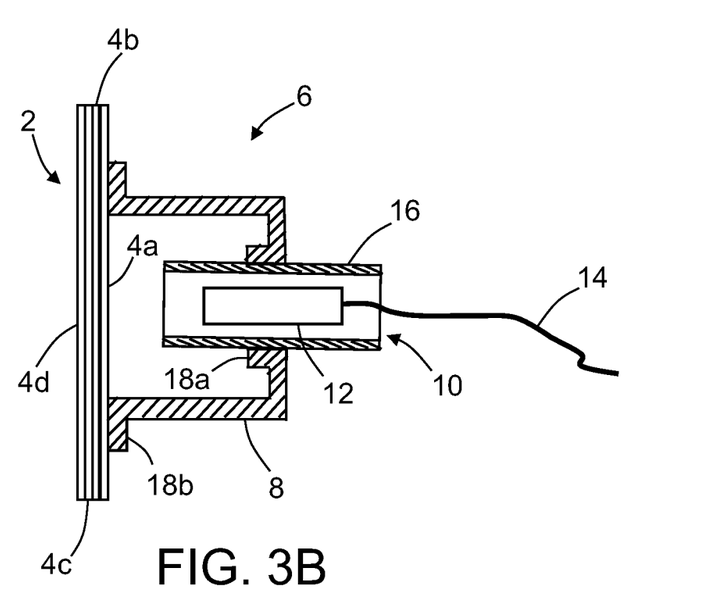
FIG. 3B is a diagram representing a partly sectioned side view of a system consisting of the magnetic field sensor and modulation screen depicted in FIG. 3A held in positional relationship by a magnetically shielded support frame in accordance with one proposed implementation.

FIG. 3B is a diagram representing a partly sectioned side view of a magnetic field sensing system 6 consisting of a magnetic field sensor 10 held in positional relationship with the magnetic field modulation screen 2 by a support frame 8. The support frame 8 may be constructed as required by the application as long as the pixel plane is positioned properly in front of the sensor in the direction that is to be measured. In the example construction seen in FIG. 3B, the support frame 8 has a flange 18a that holds the tube 16 made of magnetic shielding material and a flange 18b to which the magnetic field modulation screen 2 is attached. The support frame 8 is configured so that the overlapping and mutually offset arrays of pixel loops of the magnetic field modulation screen 2 are disposed within the field of view of the magnetic field sensor 10. The support frame 8 may be made of rigid or semi-rigid material. The surfaces of the support frame 8 (which partly encloses the magnetometer 12) may be coated with magnetic shielding material.

Even though placing the sensor inside a high-permeability ferromagnetic metallic alloy tube significantly lowers the noise floor of the sensor (by about two orders of magnitude) and restricts somewhat its field of view, by itself the high-permeability ferromagnetic metallic alloy is not sufficient to achieve the objective of creating an image plane that is divided into individual pixels that can be sensed to generate an image of a magnetic field distribution. To achieve that objective, the magnetic field sensor 10 is inserted inside the support frame 8 with one surface of that support frame facing the sensor while all other surfaces are covered with a mu-metal layer.

The methodology for generating pixels in an imaging plane for the purpose of magnetic field visualization will now be described in more detail. To transform an aperture into a set of pixels, the system proposed herein is able to detect a signal in a given pixel that is unique to that pixel not by individually sensing each pixel, but rather by measuring the whole screen as one image at a sampling rate and then comparing each of the samples. Knowing the algorithm and the pattern being cycled through the loops, one can deduce the value at each pixel, thereby reconstructing the image. The method proposed herein promises to be scalable and low cost. That method uses a single sensor that can reconstruct individual pixels through association with a known pseudo-random pattern determined by a compressive sensing algorithm. Each pixel captures a portion of the total image. The system attempts to "null" the magnetic field at various pixel locations (effectively creating a digital 0) and letting the signal come through the pixel (this is effectively a digital 1). This allows for image generation by rastering through the pixel array.

As previously described with reference to FIG. 2, pixel loops 20 are formed by loops of wire that are arranged in the form of an array. When current flows through a pixel loop 20, a magnetic field is generated that scales with the size of the loop, the number of turns, and the magnitude of the current. In this case, the pixels that essentially represent the image (signal) will have no current flowing through the loops. There is the possibility that a secondary magnetic field will be generated at an unpowered loop in the case of rapidly changing magnetic field (Lenz's law). This signal is expected to be small, mainly because the objective is to image slowly changing magnetic fields and this secondary signal will scale with the derivative of the flux through a given loop. However, that provides motivation for a method to create a null of near zero amplitude in a pixel loop 20.

The system proposed herein is configured to feed a current in an individually addressable pixel loop 20 that generates a magnetic field in that loop. The current fed into a given loop is one of "white noise" with a time average of essentially zero. The idea is that any signal present in a loop (from the source of interest) would drown in the white noise present in the loop, provided the amplitude of the white noise is of the same order of magnitude as the signal itself. This can be determined experimentally by measuring the total field through the aperture without powering any loops. Another caveat is that the characteristic frequency of the white noise current injected into the loops will need to be much higher that the frequency response of the sensor itself, so that the sensor will only detect the time average of the white noise (a null) in the location of a powered loop. This process allows the creation of a synthetic image by nulling the signal in all loops and then collecting the signal for each loop by rastering through the individual pixels in the array. Keeping in mind that the magnetic fields being imaged are very weak, One possible implementation involves making multiple measurements per loop and then averaging them together.

Figure 4A:
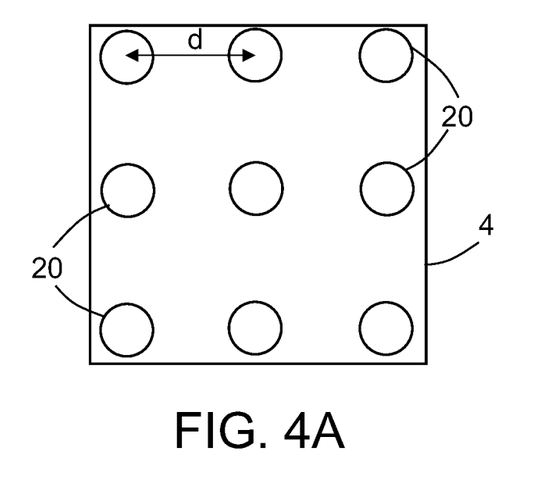
FIG. 4A is a diagram showing a loop pattern in which the loops are separated by a distance d to minimize interference between a powered loop and adjacent loops.
Figure 4B:
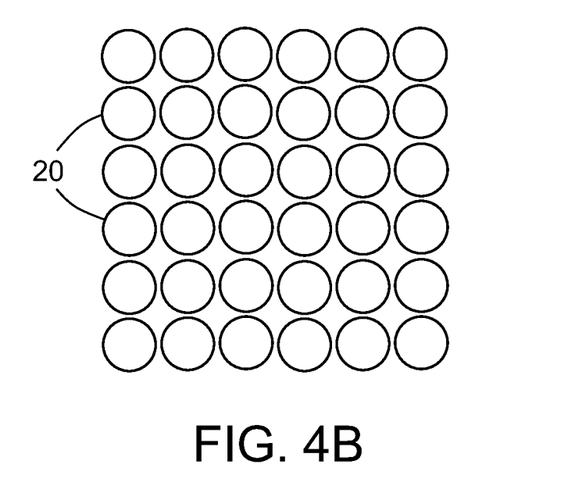
FIG. 4B is a diagram showing a loop pattern having a desired density of loops to improve resolution.
Figure 4C:
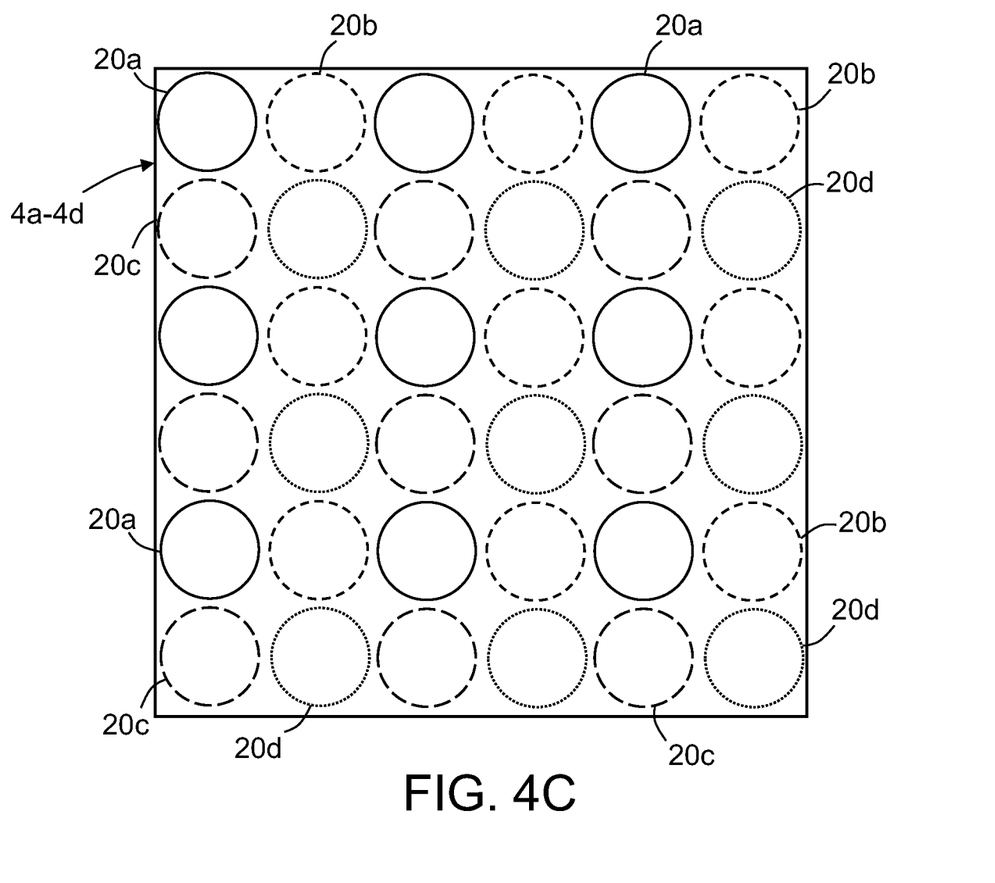
FIG. 4C is a diagram showing loops residing on different PCBs arranged in a stack that achieves the desired density depicted in FIG. 4B using the loop pattern depicted in FIG. 4A.

A schematic representation of the loop pattern of the modulation screen in accordance with one embodiment is depicted in FIGS. 4A-4C. FIG. 4A is a diagram showing a loop pattern in which the loops 20 on a PCB 4 are spaced apart by a distance d>>2r (where d is measured from center to center and r is the loop radius) to minimize interference between a powered loop and adjacent loops. FIG. 4B is a diagram showing a loop pattern having a specific density of loops 20 designed to improve resolution. It may be possible to increase density and therefore resolution by making the loops smaller. FIG. 4C is a diagram showing a plurality of arrays of loops residing on respective PCBs 4a-4d arranged in a stack that achieves the desired density depicted in FIG. 4B using mutually offset loop patterns of the type depicted in FIG. 4A. In FIG. 4C, the loops 20a (indicated by solid circles) are printed on PCB 4a; the loops 20b (indicated by dashed circles with short dashes) are printed on PCB 4b; the loops 20c (indicated by dashed circles with long dashes) are printed on PCB 4c; and the loops 20d (indicated by dotted circles) are printed on PCB 4d. The PCBs 4a-4d are shown in a stack in FIGS. 3A and 3B.

As seen in FIG. 4A, the loops 20 on a PCB 4 are separated from each other by a certain distance, so that the magnitude of any induced field due to the "white noise" input at a given loop does not generate spurious signals at a nearby loop, i.e., the magnitude of any induced field is much smaller than the "signal" amplitude in the "image" of the non-powered loop. Since a physical separation of loops on a single plane would effectively create a very sparse pixel array or very low resolution image, adjacent loops are placed on different circuit boards that are stacked on top of each other, which effectively increases the distance between loops, even though their projections on the aperture plane of the sensor constitute a dense array. It should be appreciated that FIGS. 4A-4C are meant to illustrate the concept. In the future, more complex modulation screens can be implemented as well as more integrated electronic controls.

The field generated in the loops by the current fed to them is a dipole field whose symmetry axis is along the normal in the center of the loop. This field will readily couple to the field of an adjoining loop unless the adjoining loop is at a sufficient distance d (shown in FIG. 4A) from the selected loop. The dipole field in the loop will decay as $1/d^3$. In the application proposed herein, the distance d is defined operationally to be of a magnitude such that the induced field in an adjoining unpowered loop is ≈1% of the field induced in the current-carrying loop, which is effectively 4.2r, where r is the radius of an individual loop. This operational definition may be changed in other implementations.

In the proposed implementation the pixel loops 20 are formed using copper traces on a PCB. To achieve the requirement of ≈1% interference, the loops need to be located as drawn in the configuration shown in FIG. 4A, which would severely limit the image resolution. Ideally, the loop configuration should be similar to what is shown in FIG. 4B, where the loops are nestled closely together. To meet both objectives, the pixel loops 4a-4c on four PCBs stacked on top each other are mutually offset as shown in FIG. 4C.

Furthermore, since the wires that feed the current to the loops also generate fields, it is necessary that the current feed wires 22 and 24 (shown in FIG. 2) be essentially on top of each other (on different layers of the PCB) so that the fields produced by the incoming and outgoing currents cancel each other.

Figure 5:
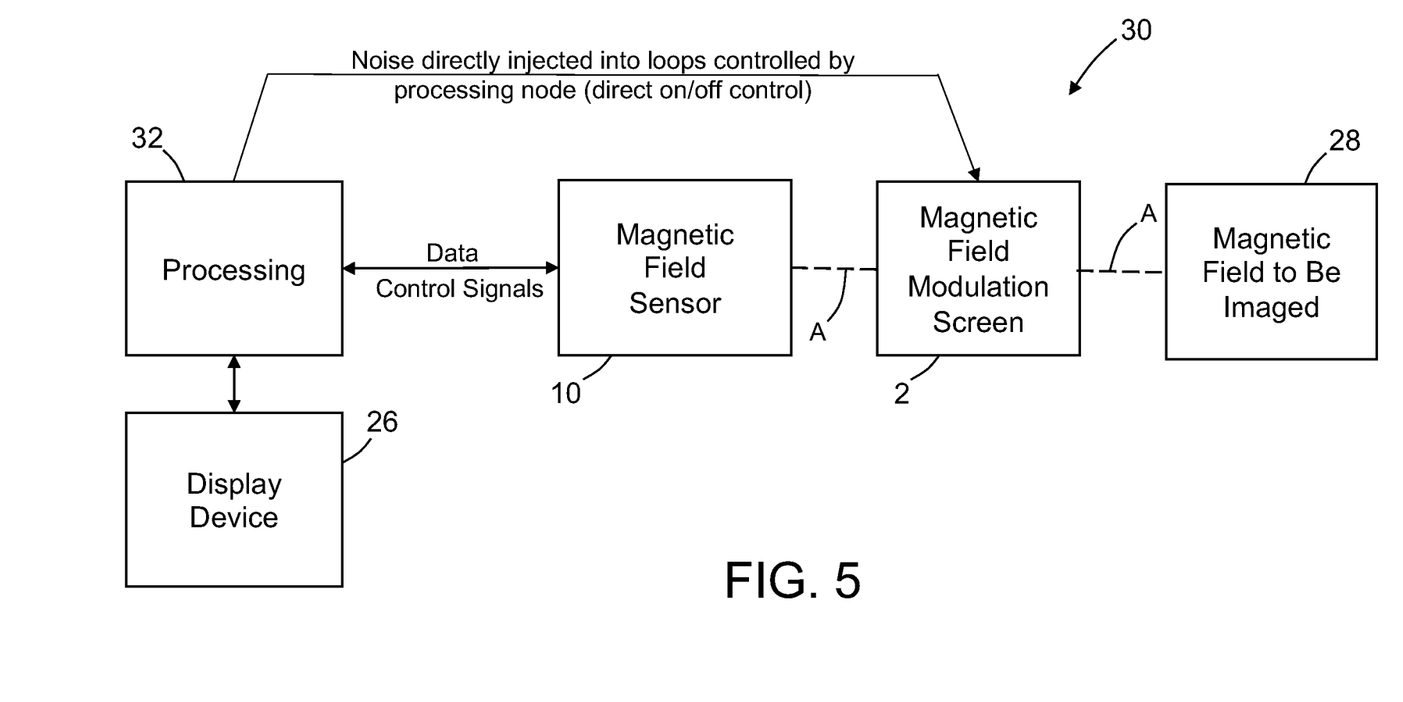
FIG. 5 is a block diagram identifying components of a system for visualizing magnetic fields in accordance with one embodiment.

FIG. 5 is a block diagram identifying components of a magnetic field visualization system 30 for visualizing magnetic fields in accordance with one embodiment. The magnetic field visualization system 30 includes a processing node 32 that has two-way communication with the magnetic field sensor 10. The processing node 32 sends control signals to the magnetic field sensor 10 and receives sensor data from magnetic field sensor 10. In cases where the magnetic field sensor 10 includes an atomic magnetometer, the control signals control activation of a laser and the sensor data is received by a processor. The magnetic field sensor 10 measures the magnetic field 28 to be imaged along an axis A indicated by dashed lines in FIG. 5. More specifically, the magnetic field sensor 10 measures the magnetic field at individual pixel loops of the magnetic field modulation screen which have been selected by the processing node 32. The processing node 32 is configured to inject current in the form of noise directly into selected pixel loops 20 by direct on/off control of switches (not shown in FIG. 5, but see switching array 46 in FIG. 7). The processing node 32 processes the sensor data received from magnetic field sensor 10 and sends the processed data to a display device 26 in a format suitable for visualization of the detected magnetic field. More specifically, the pixels displayed on the screen of the display device 26 will display multiple colors, gray shading, symbology, or other ways of visualization which are a function of the associated magnetic fluxes at each successively unpowered pixel loop of the magnetic field modulation screen. The processing node 32 may be a computer having multiple processors for performing different tasks such as sensor control, data processing, display control, and switch control. In particular, one processor may be configured to perform a magnetic field visualization application in the form of executable computer code stored in a non-transitory tangible computer-readable storage medium (e.g., read only memory), which application includes an image reconstruction algorithm configured to reconstruct an image representing the distribution of the detected magnetic field using compressive sensing techniques.

Figure 6:
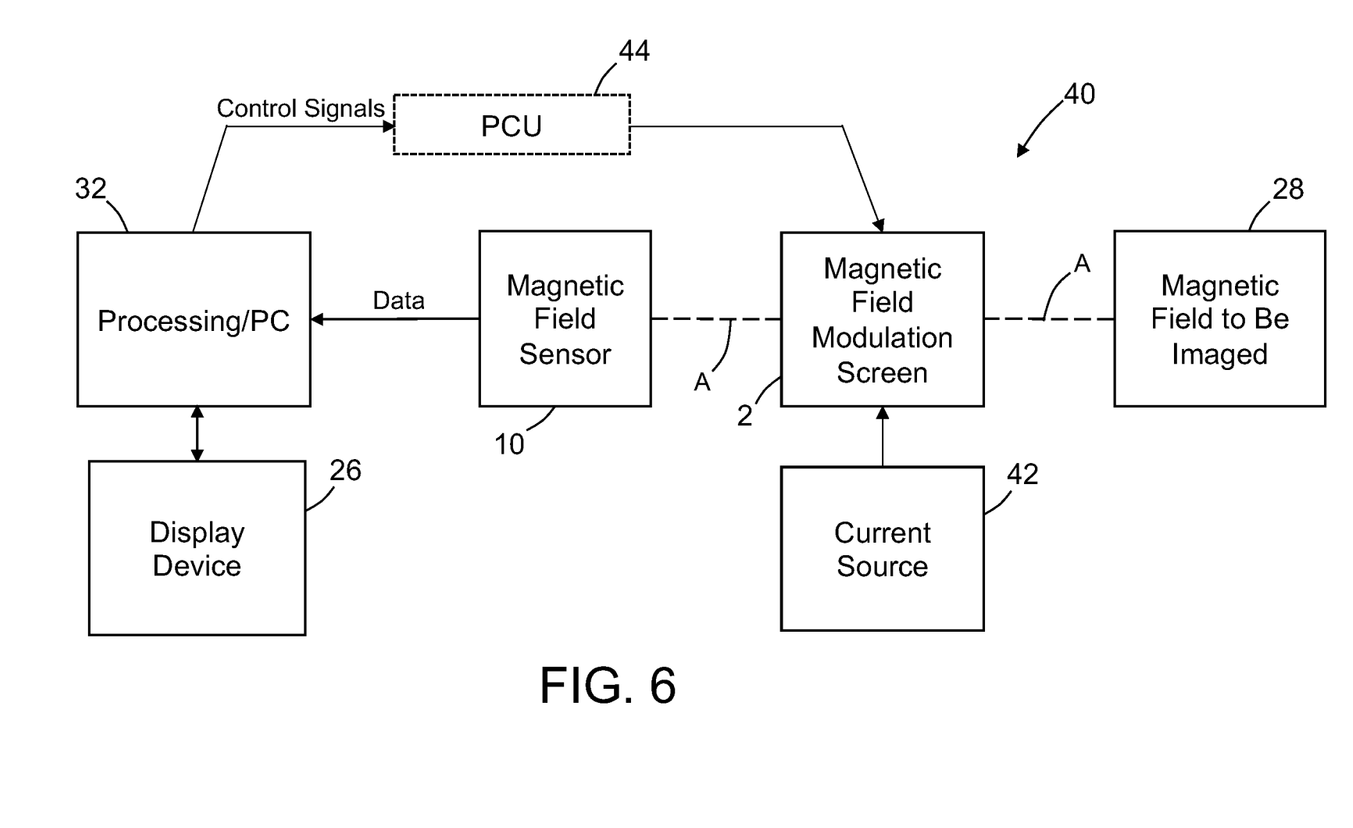
FIG. 6 is a block diagram identifying components of a system for visualizing magnetic fields in accordance with another embodiment.

FIG. 6 is a block diagram identifying components of a magnetic field visualization system 40 for visualizing magnetic fields in accordance with an alternative embodiment. The magnetic field visualization system 40 includes a programmable control unit (PCU) 44 which controls the switching array 46 (see FIG. 7) in accordance with control signals received from the processing node 32. For example, the PCU 44 may be a microcontroller board. Depending on which pixel loop is not being nulled, a current source 42 supplies current (e.g., white noise) to the other pixel loops. Noise current flows through those pixel loops to effectively "block" the magnetic field 28 when the control signal to the switching array 46 activates switches to allow current to flow through the associated pixel loops. The processing node 32 (which may be a personal computer) processes sensor data received from magnetic field sensor 10 and sends the processed data to a display device 26 in a format suitable for visualization of the detected magnetic field.

Figure 7:
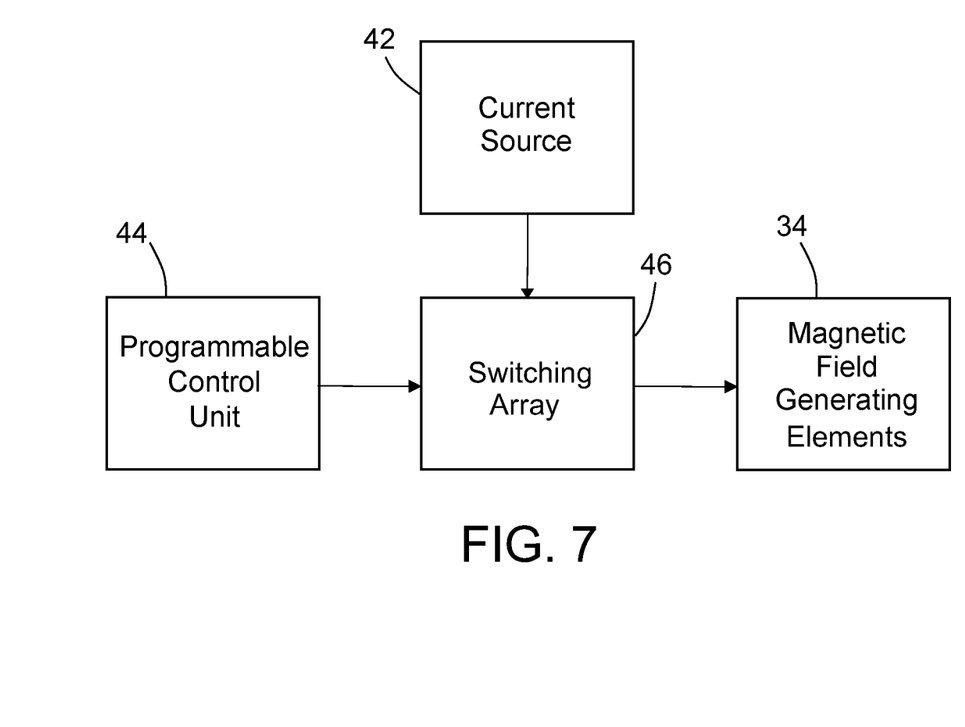
FIG. 7 is a block diagram identifying components of a subsystem for controlling which pixel loops receive electrical current during operation of the magnetic field modulation screen depicted in FIG. 3A.

It should be appreciated that the individually addressable and controllable magnetic field-generating elements of the magnetic field modulation screen 2 need not be loops. For, example, the individually addressable and controllable magnetic field-generating elements of the magnetic field modulation screen 2 may be wires which are not formed into the shape of a loop or other inductor-like objects that have an actuatable magnetic field. FIG. 7 is a block diagram identifying components of an aperture subsystem for controlling which magnetic field-generating elements 34 of the magnetic field modulation screen 2 receive noise current during modulation of the magnetic field. The magnetic field-generating elements 34 (e.g., pixel loops) are respectively connected to switches of a switching array 46. The states of the switches are controlled by the PCU 44 in accordance with control signals received from the processing node 32.

The aperture in an experimental system may comprise 384 pixel loops with an element pitch of 0.248 inch. During the experiment, the aperture subsystem receives control signals from the PCU 44 and implements those control signals to arbitrarily set the state of a set of loops in the pixel array. A single-winding current loop with a 3-mm radius was chosen as the element where the magnetic field was induced, although in alternate implementations this element may comprise multiple windings. The effective distance between adjacent loops (albeit these loops are on different PCBs) is 0.3 mm. This choice is validated by numerical simulation results which show an induced maximum magnetic field strength at the loop of $5.2 \times 10^{-7}$ Tesla at 1-mA drive current.

Figure 8A:
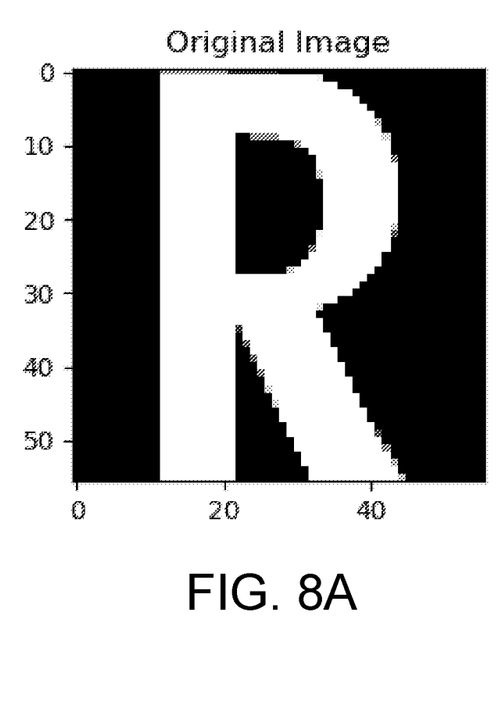
FIG. 8A is a diagram showing an original image derived by projecting light onto a digital micro-mirror device consisting of an array of N mirrors, where each mirror corresponds to a pixel in the image and is individually controlled to perform a raster scan that involves taking N measurements, one measurement for each mirror in the device.
Figure 8B:
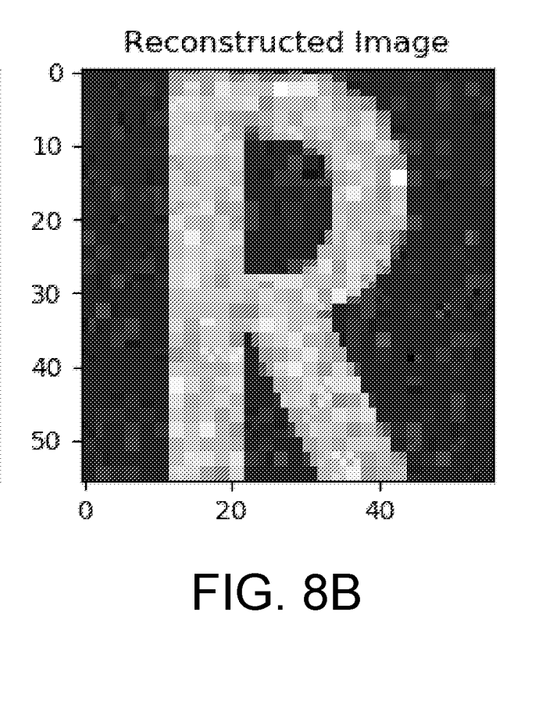
FIG. 8B is a diagram showing a reconstructed image derived by projecting light onto less than all of the N mirrors of a digital micro-mirror device individually using compressive sensing to closely approximate the original image shown in FIG. 8A without having to take N measurements.

The pixel loop array proposed herein is analogous to a digital micro-mirror device. FIG. 8A is a diagram showing an original image derived by projecting light onto a digital micro-mirror device consisting of an array of N mirrors, where each mirror corresponds to a pixel in the image and is individually controlled to perform a raster scan that involves taking N measurements, one measurement for each mirror in the device. FIG. 8B is a diagram showing a reconstructed image derived by randomly projecting (filtering) light onto less than all of the N mirrors of the digital micro-mirror device individually using compressive sensing to closely approximate the original image shown in FIG. 8A without having to take N measurements. The original image is 56×56 pixels, i.e., 3136 total pixels, and the image on the right was produced using only 800 measurements. Depending on image details one is attempting to form, i.e., how sparse it is in a particular basis set, the number of measurements needed could easily be reduced by orders of magnitude.

Compressive sensing relies on the property that most images are sparse in some domain. This means that the image can be represented using a set of K basis vectors, where K is much smaller than the number of pixels in the image. Compressive sensing directly acquires the compressed image without the overhead of taking a large amount of initial measurements or encoding the locations of the sparse coefficients, as is common in other image compression techniques. The key steps are: (a) designing a stable measurement matrix such that the important information in the N-dimensional compressible image is not lost by reducing the dimension of the image to K, where K<N; and (b) performing a reconstruction algorithm to recover the image from the K measurements. One promising application of this technique is a method to image magnetic field distributions that utilizes compressive sensing to reduce the number of measurements needed to obtain an image.

As mentioned in the example above, one possible way to design a K×N measurement matrix Θ involves defining the rows by generating a pseudo-random sequence of 0 s and 1 s. For a given row of the matrix, the columns correspond to a pixel in the image. Thus, each measurement can be viewed as a linear combination of the pixels of the original image. The K-dimensional measurement vector y is given by $$\Theta \Psi x = \Theta s = y,$$

where s is the sparse image under the basis Ψ, where the image is assumed sparse.

The reconstruction algorithm uses y, Θ, and Ψ and reconstructs the N-dimensional image x by solving the linear system above. Since the linear system is underdetermined, they are infinitely many s' that satisfy $$\Theta s = y$$

The classic approach to solving underdetermined linear systems is to find the vector with the smallest $\ell_2$ norm that solves the linear system. Here, the $\ell_p$ norm of a vector is given by $$(\|s\|_p)^p = \sum_{i=0}^{N} |s_i|^p$$

However, the minimization with the $\ell_2$ norm rarely finds a sparse solution. It has been proven that minimization with respect to the $\ell_1$ norm can exactly recover sparse signals and closely approximate compressible signals with high probability using only $$M \geq cK \log\left(\frac{N}{K}\right)$$

independent and identically distributed Gaussian random measurements.

Figure 9:
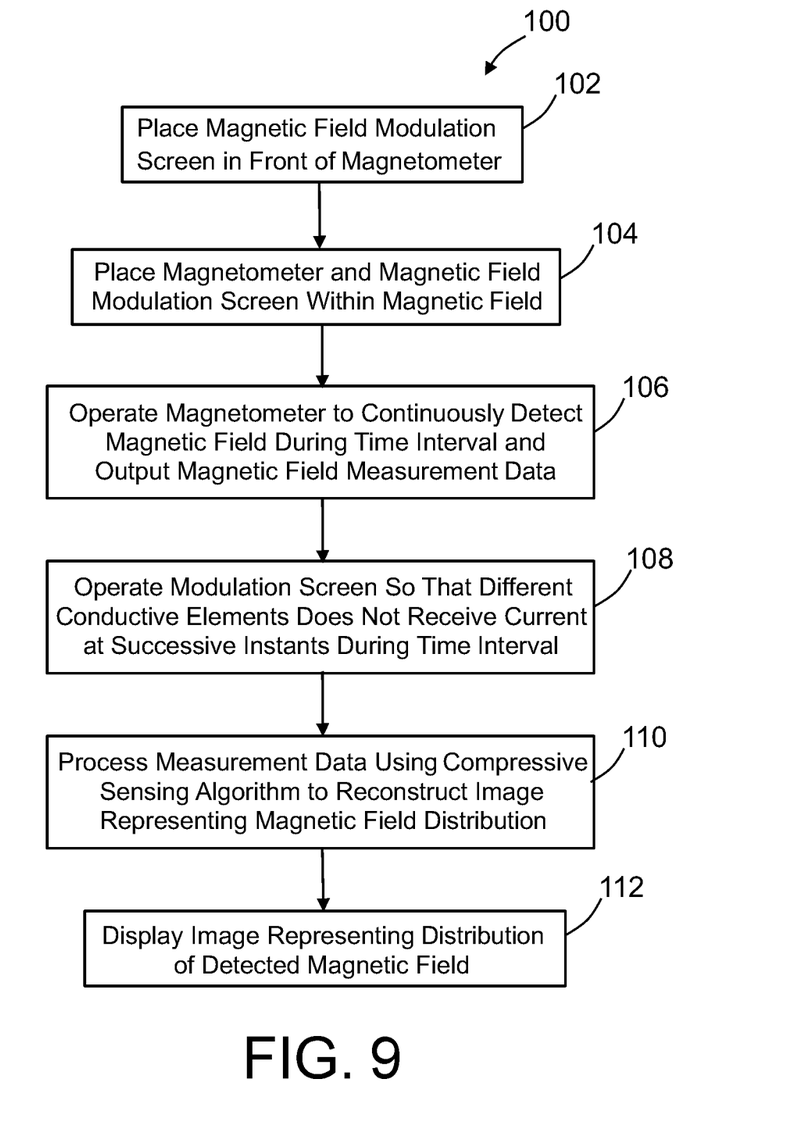
FIG. 9 is a flowchart identifying steps of a method for visualizing a magnetic field in accordance with one embodiment.

The system components described above with reference to FIGS. 3A, 4C, and 5-8 may be utilized to perform a method for visualizing a magnetic field in accordance with the teachings herein. FIG. 9 is a flowchart identifying steps of a method 100 for visualizing a magnetic field in accordance with one embodiment. First, a magnetic field modulation screen comprising an array of individually addressable and controllable magnetic field-generating elements is placed in a fixed position relative to a magnetometer (step 102). Then the magnetometer and the magnetic field modulation screen are placed in a magnetic field (step 104). After the rest of the system has been set up, the magnetometer is operated to continuously detect the magnetic field during a time interval and output electrical signals containing magnetic field measurement data (step 106). In addition, the magnetic field modulation screen is operated such that a different one of the magnetic field-generating elements does not receive current from the current source at successive instants during the time interval (step 108). The magnetic field measurement data is processed using an image reconstruction algorithm that incorporates compressive sensing techniques to reconstruct an image representing a distribution of the magnetic field (step 110). The image representing the distribution of the detected magnetic field is displayed on the screen of the display device (step 112).

While systems and methods for visualizing low-level magnetic fields have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The embodiments disclosed above use one or more computer systems. As used in the claims, the term "computer system" may comprise a single processing or computing device or multiple processing or computing devices that communicate via wireline or wireless connections. A processing or computing device may include any one of the following: processor, computer, controller, central processing unit, microcontroller, reduced instruction set computer processor, application-specific integrated circuit, programmable logic circuit, field-programmable gated array, digital signal processor, and/or any other circuit or processing device capable of executing the functions described herein.

The methods described herein may be encoded as executable instructions embodied in a non-transitory tangible computer-readable storage medium, including, without limitation, a storage device and/or a memory device. Such instructions, when executed by a processing or computing device, cause the device to perform at least a portion of the method described herein.

The method claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatingly unless the claim language explicitly states a condition that precludes such an interpretation.

The invention claimed is:

1. A magnetic field sensing system comprising a magnetometer, a magnetic field modulation screen, and a support frame that supports the magnetometer and magnetic field modulation screen in a positional relationship, wherein the magnetic field modulation screen comprises a printed circuit board having a set of magnetic field-generating elements printed thereon which form a pixel plane; and wherein the support frame is constructed so that the pixel plane is positioned in front of and at a distance from the magnetometer.

2. The magnetic field sensing system as recited in claim 1, further comprising magnetic shielding.

3. The magnetic field sensing system as recited in claim 1, wherein the set of magnetic field-generating elements comprises an array of individually addressable and controllable magnetic field-generating elements.

4. The magnetic field sensing system as recited in claim 3, further comprising a current source, wherein the magnetic field modulation screen further comprises an array of switches arranged to switchably connect the current source to respective magnetic field-generating elements.

5. The magnetic field sensing system as recited in claim 1, wherein each magnetic field-generating element comprises a loop.

6. The magnetic field sensing system as recited in claim 5, wherein each magnetic field-generating element further comprises first and second current feeder lines which are electrically connected to the loop and disposed mutually parallel in contact with each other.

7. The magnetic field sensing system as recited in claim 4, further comprising a controller connected to the array of switches and configured to control the switches to provide current from the current source to all but one of the magnetic field-generating elements.

8. The magnetic field sensing system as recited in claim 7, further comprising a processing node connected to the controller and configured to send control signals to the controller which cause the magnetic field modulation screen to adopt successive states in which a different one of the magnetic field-generating elements does not receive current from the current source at successive instants in time.

9. The magnetic field sensing system as recited in claim 4, further comprising a processing node connected to the array of switches and configured to control the switches to adopt successive states in which a different one of the magnetic field-generating elements does not receive current from the current source at successive instants in time.

10. The magnetic field sensing system as recited in claim 1, further comprising a tube made of magnetic shielding material and having a geometry with an axis and an opening at an end, wherein the magnetometer is disposed inside the tube with a field of view of the magnetic field modulation screen which is defined in part by the opening of the tube which is closest to the magnetic field modulation screen.

11. A magnetic field sensing system comprising a magnetometer, a magnetic field modulation screen, and a support frame that supports the magnetometer and magnetic field modulation screen in a positional relationship, wherein the magnetic field modulation screen comprises a plurality of printed circuit boards having respective sets of magnetic field-generating elements printed thereon, and wherein the printed circuit boards are positioned in an overlapping relationship such that the sets of magnetic field-generating elements are offset from each other.

12. A magnetic field visualization system comprising:
a current source;
a display device configured to display an image representing a magnetic field distribution;

a magnetometer configured to detect a magnetic field during a time interval and output electrical signals containing magnetic field measurement data;

a magnetic field modulation screen disposed with a fixed positional relationship to the magnetometer, wherein the magnetic field modulation screen comprises an array of magnetic field-generating elements and an array of switches respectively connected to the magnetic field-generating elements and to the current source; and a processing node connected to the array of switches and configured to control the switches to adopt successive states in which a different one of the magnetic field-generating elements does not receive current from the current source at successive instants during the time interval, wherein the processing node is further configured to process the magnetic field measurement data using an image reconstruction algorithm to reconstruct an image representing a distribution of the magnetic field using compressive sensing techniques and then send the processed data to the display device for display of the image representing the distribution of the detected magnetic field.

13. The magnetic field visualization system as recited in claim 12, wherein:
the magnetic field modulation screen has a number of magnetic field-generating elements; and
the processing node is further configured to control the array of switches such that a number of magnetic field-generating elements which do not receive current in the successive states is less than the number of magnetic field-generating elements.

14. The magnetic field visualization system as recited in claim 12, further comprising a tube made of magnetic shielding material and having a geometry with an axis and an opening at an end, wherein the magnetometer is disposed inside the tube with a field of view of the magnetic field modulation screen which is defined in part by the opening of the tube which is closest to the magnetic field modulation screen.

15. The magnetic field visualization system as recited in claim 14, wherein the magnetometer is an atomic magnetometer.

16. The magnetic field visualization system as recited in claim 12, wherein the magnetic field modulation screen comprises a plurality of printed circuit boards having respective sets of magnetic field-generating elements printed thereon, and wherein the printed circuit boards are positioned in an overlapping relationship such that the sets of magnetic field-generating elements are offset from each other.

17. A magnetic field modulation screen comprising:
a first printed circuit board having a first spaced set of magnetic field-generating elements printed thereon; and
a second printed circuit board having a second spaced set of magnetic field-generating elements printed thereon;
wherein the first and second printed circuit boards are positioned in an overlapping relationship with the first spaced set offset from the second spaced set.

18. The magnetic field modulation screen as recited in claim 17, further comprising:
a third printed circuit board having a third spaced set of magnetic field-generating elements printed thereon; and
a fourth printed circuit board having a fourth spaced set of magnetic field-generating elements printed thereon;

wherein the first through fourth printed circuit boards are positioned in an overlapping relationship with each of the first through fourth spaced sets being offset from the others.

19. The magnetic field modulation screen as recited in claim 18, wherein each magnetic field-generating element comprises a loop.

20. A method for visualizing a magnetic field, the method comprising:
- placing a magnetic field modulation screen comprising an array of individually addressable and controllable magnetic field-generating elements in a fixed position relative to a magnetometer;
- placing the magnetometer and the magnetic field modulation screen within a magnetic field;
- operating the magnetometer to continuously detect the magnetic field during a time interval and output electrical signals containing magnetic field measurement data;
- operating the magnetic field modulation screen such that a different one of the magnetic field-generating elements does not receive current from the current source at successive instants during the time interval;
- processing the magnetic field measurement data using an image reconstruction algorithm that incorporates compressive sensing techniques to reconstruct an image representing a distribution of the magnetic field; and
- displaying the image representing the distribution of the detected magnetic field.

* * * * *